US006746616B1

United States Patent
Fulford et al.

(10) Patent No.: US 6,746,616 B1
(45) Date of Patent: Jun. 8, 2004

(54) METHOD AND APPARATUS FOR PROVIDING ETCH UNIFORMITY USING ZONED TEMPERATURE CONTROL

(75) Inventors: H. Jim Fulford, Austin, TX (US); Jeremy Lansford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/818,666

(22) Filed: Mar. 27, 2001

(51) Int. Cl.[7] .................................................. C23F 1/00
(52) U.S. Cl. ........................... 216/59; 216/63; 216/67; 216/74; 216/79
(58) Field of Search ........................... 216/59, 63, 67, 216/74, 79

(56) References Cited

U.S. PATENT DOCUMENTS 5,375,064 A  * 12/1994  Bollinger .................... 216/59
5,795,493 A  *  8/1998  Bukhman et al. ........... 438/709

OTHER PUBLICATIONS

Math Glossary of Terms, Wisconsin Model Academics Standards, http://www.dpi.state.wi.us/dpi/standards/mathglos.html.*

* cited by examiner

Primary Examiner—Nadine G. Norton
Assistant Examiner—Binh X. Tran
(74) Attorney, Agent, or Firm—Williams, Morgan & Amerson, P.C.

(57) ABSTRACT

In one illustrative embodiment, a system is comprised of a semiconductor processing tool, an etcher, a metrology tool, and a controller. The semiconductor processing tool is capable of forming a process layer above a semiconducting substrate. The etcher is capable of removing at least a portion of the process layer. The metrology tool is capable of measuring a first depth of the etch at a first location in a first preselected region of the semiconducting substrate. The controller is capable of comparing the first depth to a desired depth, and varying the temperature of a subsequently processed semiconducting substrate in a region corresponding to the first preselected region in response to the first depth being different from the desired depth.

34 Claims, 6 Drawing Sheets

US 6,746,616 B1

METHOD AND APPARATUS FOR PROVIDING ETCH UNIFORMITY USING ZONED TEMPERATURE CONTROL

BACKGROUND OF THE INVENTION

1. Field of the Invention

The present invention is generally directed to the field of semiconductor processing, and, more particularly, to a method of controllably etching a semiconductor wafer.

2. Description of the Related Art

In general, semiconductor devices are manufactured by forming many process layers comprised of various materials above a semiconducting substrate, and, thereafter, removing selected portions of the layers, i.e., patterning the layers. This patterning may be accomplished using known photolithography and etching processes to define the various features of the device, e.g., the gate insulation layer, the gate electrode, metal lines and contacts, etc. This forming and patterning of the process layers is typically performed layer by layer as the individual layers are formed, although multiple layers may be patterned at any given time.

Photolithography is a common process used in patterning these various layers. Photolithography typically involves the use of a product known as photoresist. In general terms, photoresist is a product whose solubility in a developer may be manipulated by exposure to a light source. There are positive and negative photoresists currently available on the market.

In general, the photolithography process involves forming a layer of photoresist above a previously formed process layer, and exposing selected portions of the layer of photoresist to a light source to form a pattern in the photoresist that is desired to be formed in the under-lying process layer. All of these steps are typically performed in well-known photolithography modules that include a section for depositing the photoresist on the wafer, e.g., a spin-coating station, a device for selectively exposing portions of the photoresist layer to a light source through a reticle, e.g., a stepper, and a section for rinsing and developing the photoresist layer after it has been selectively exposed to the light source. Thereafter, an etching process, such as a plasma etching process, is performed to remove portions of the underlying process layer that are not covered by the patterned layer of photoresist, i.e., the patterned layer of photoresist acts as a mask. After the etching process is complete, the patterned photoresist layer is removed so that additional process layers may be formed above the now go patterned process layer.

One significant aspect in semiconductor device manufacturing involves controlling material removal processes, such as etching. Generally, most features on a semiconductor device are formed by depositing layers of material (e.g., conductive or insulative) and patterning the layers using photolithography and etch processes. There are many variables that affect the accuracy and repeatability of the material removal processes used to form the features. One particular type of material removal tool uses a plasma etch process to perform a primarily anisotropic etch to form features on a semiconductor wafer. Certain etch recipes involve controlling the duration of the etch using a predetermined time. For such a timed etch to be robust, the etch rate of the tool must be predictable and repeatable. Other etch recipes proceed with the etch until an endpoint determination is made. Various techniques are available for detecting etch endpoints. For example, during a plasma etch process the plasma chemistry noticeably changes when a top layer is etched through and the tool begins to etch the underlying layer. The chemistry of the etch chamber is monitored, using for instance an optical emission spectrometer, and the etch is terminated when the change in chemistry is detected. Some etching processes involve the use of both a timed etch process to remove the bulk of the material and an endpoint determination process to determine when processing is complete.

As technology improvements facilitate smaller critical dimensions for semiconductor devices, the need to reduce errors increases dramatically. Proper formation of subsections within a semiconductor device is an important factor in ensuring proper performance of the manufactured semiconductor device. Critical dimensions of the subsections generally have to be within a predetermined acceptable margin of error for semiconductor devices to be within acceptable manufacturing quality.

Conventional etching processes suffer from a number of deficiencies. For example, conventional etching does not account for spatial variations in the rates of removal of the process layer. That is, the etching process may remove material faster in certain regions of the wafer, and slower in other regions. For example, the etching process may completely remove the process layer at the edge of the wafer, while the process layer remains at the center of the wafer, or vice versa. With the advent of larger wafers (e.g., some manufacturers are in the process of moving to twelve inch wafers), the problem of spatial variations is exacerbated. Moreover, since the endpoint may not be signaled until all, or substantially all, of the process layer is removed, portions of underlying process layers in areas where the process layer has been removed first may be unnecessarily subjected to more of the etching process than would otherwise be necessary.

The present invention is directed to a method that minimizes or reduces some or all of the aforementioned problems.

SUMMARY OF THE INVENTION

The present invention is directed to a system. The system is comprised of a semiconductor processing tool, an etcher, a metrology tool, and a controller. The semiconductor processing tool is capable of forming a process layer above a semiconducting substrate. The etcher is capable of removing at least a portion of the process layer. The metrology tool is capable of measuring a first depth of the etch at a first location in a first preselected region of the semiconducting substrate. The controller is capable of comparing the first depth to a desired depth, and varying the temperature of a subsequently processed semiconducting substrate in a region corresponding to the first preselected region in response to the first depth being different from the desired depth.

In another aspect of the instant invention, a method is provided. The method is comprised of forming a process layer above a semiconducting substrate; etching at least a portion of said process layer; and measuring a first depth of the etch at a first location in a first preselected region of the semiconducting substrate. Thereafter, the first depth is compared to a desired depth, and the temperature of a subsequently processed semiconducting substrate in a region corresponding to the first preselected region is varied in response to the first depth being different from the desired depth.

BRIEF DESCRIPTION OF THE DRAWINGS

The invention may be understood by reference to the following description taken in conjunction with the accompanying drawings, in which like reference numerals identify like elements, and in which.

Figure 1:
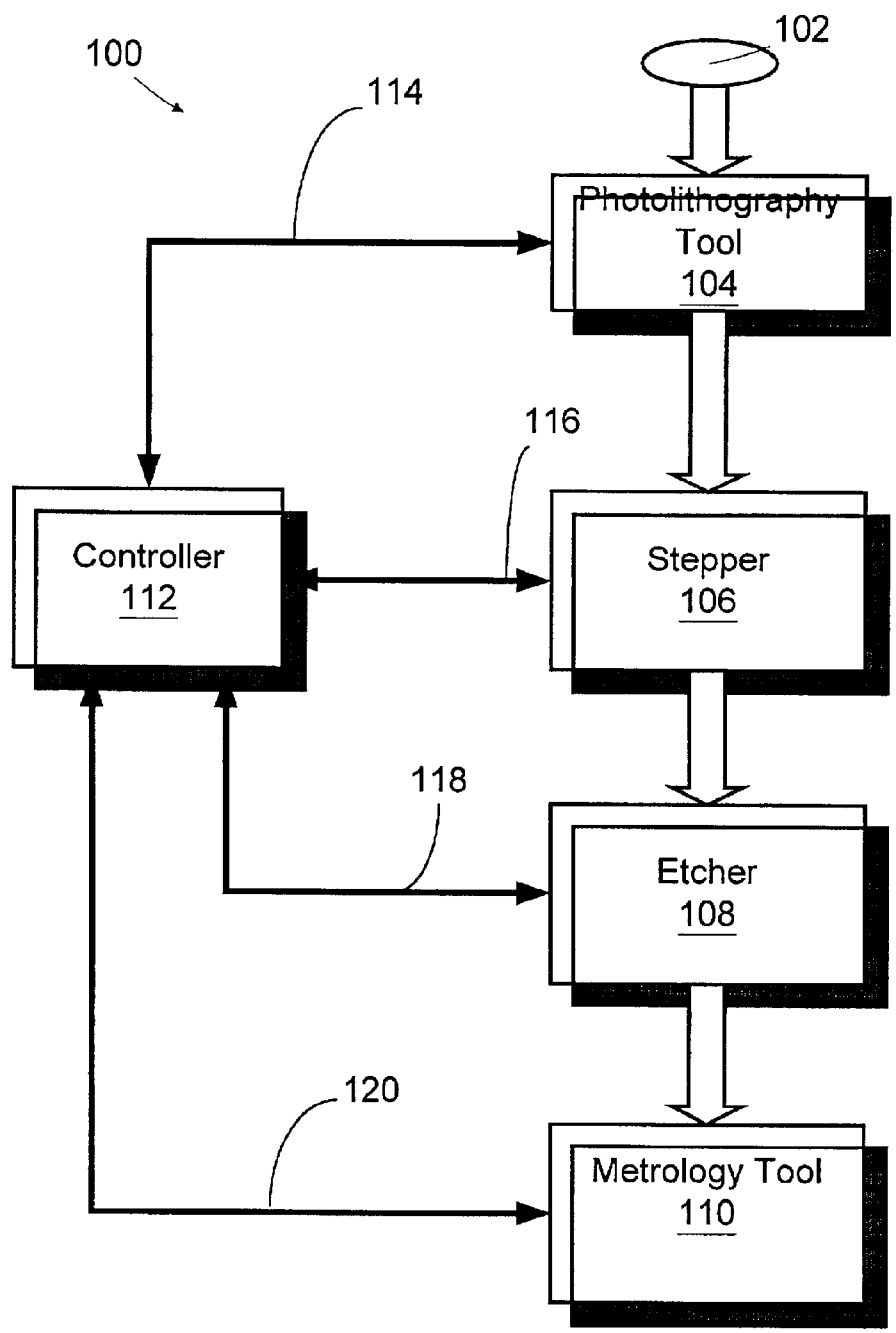
FIG. 1 depicts one illustrative embodiment of the system in which the present invention may be employed.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method and apparatus of controlling temperature within a plurality of zones on a wafer during an etching process, so as to control the etch rate within these zones. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Turning now to the drawings, and referring first to FIG. 1, one illustrative embodiment of a system 100 that may be used with the present invention is depicted. As shown therein, the system 100 processes wafers 102 and is generally comprised of a photolithography tool 104, a stepper 106, an etcher 108, a metrology tool 110, and a controller 112. The wafer 102 is generally serially processed within each of the tools 104–108, and then analyzed in the metrology tool 110. Those skilled in the art will appreciate that more or fewer tools may be included in the system 100 as is warranted to produce the desired structures on the wafer 102.

Generally, the photolithography tool 104 forms a layer of photoresist on the wafer 102. The stepper 106 controllably exposes the layer of photoresist to a light source through a mask or reticle to produce a desired pattern in the layer of photoresist. The etcher 108 removes those portions of layers underlying the layer of photoresist that are exposed by the patterning produced by the mask. The metrology tool 110 measures select parameters of the wafer 102, such as physical characteristics and/or electrical properties. The measured physical characteristics may include feature sizes, depth of an etching process, etc. The measured electrical properties may include resistance, conductivity, voltage levels, etc. In some embodiments, the metrology tool 110 may not be needed, as sufficient feedback information for controlling parameters of the tools 104–108 may be obtained from sensors (see FIG. 4) within the tools 104–108.

Figure 2:
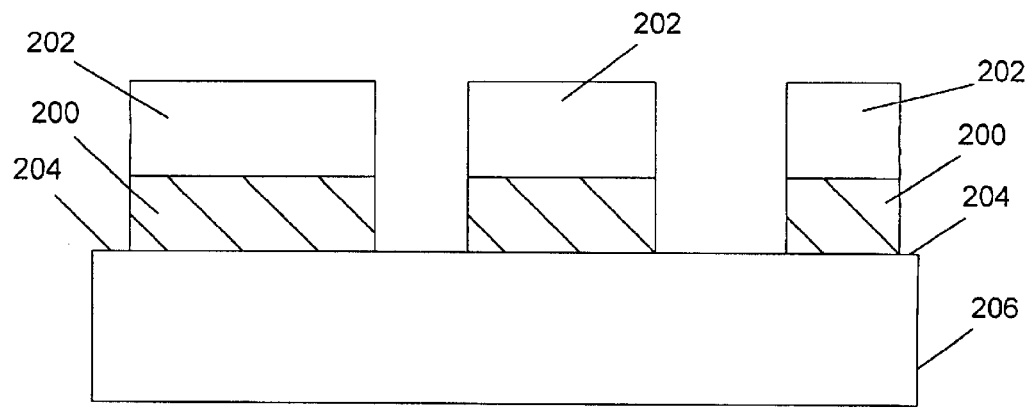
FIG. 2 depicts a cross-sectional view of a semiconducting substrate having an illustrative patterned process layer formed thereabove.

An exemplary form of the wafer 102 is stylistically illustrated in FIG. 2. FIG. 2 depicts a portion of the wafer 102 at a point during the manufacturing process where a patterned process layer 200 and a patterned layer of photoresist 202 have been formed above an upper surface 204 of a substrate 206. The patterned process layer 200 may be formed from a variety of materials used in semiconductor manufacturing operations, e.g., an oxide, an oxynitride, a nitride, silicon dioxide, silicon nitride, silicon oxynitride, polycrystalline silicon (polysilicon), a metal, e.g., aluminum, copper, tungsten, or other like materials. Moreover, the initially formed layer of material (not shown) from which the patterned layer of material 200 is formed may be formed by a variety of techniques, e.g., thermal growth, chemical vapor deposition ("CVD"), physical vapor deposition ("PVD"), sputtering, etc. The patterned process layer 200 is meant to generically represent any type of process layer that may be patterned to define a feature in a semiconductor device, e.g., a gate insulation layer, a gate electrode, openings in interlayer dielectric materials for the formation of conductive interconnections, metal lines and plugs, etc. Lastly, although the patterned process layer 200 depicted in FIG. 2 is formed immediately on the upper surface 204 of the substrate 206, the present invention is not limited to process layers so formed. Rather, as will become clear after a complete reading of the present application, the present invention may be employed on process layers formed on top of pre-existing process layers or other previously fabricated structures.

The patterned layer of photoresist 202 may be comprised of any type of photoresist material, positive or negative, useful in photolithography processing operations. As set forth in the background section of this application, the structure depicted in FIG. 2 may result from initially forming a layer of material (not shown), e.g., polysilicon, across the entire upper surface 204 of the substrate 206, forming a layer of photoresist (not shown) above the previously formed layer of material, and producing the patterned layer of photoresist using known photolithography processing techniques. Thereafter, the patterned process layer 200 may be formed by performing one or more etching processes, e.g., wet or dry, anisotropic or isotropic, using the patterned layer of photoresist 202 as a mask. These illustrative process steps will result in the structure depicted in FIG. 2.

Returning to FIG. 1, the metrology tool 110 may be any of a variety of devices used to measure electrical and/or structural features on the wafer 102 after being processed by the etcher 108. For example, the metrology tool 110 may be configured to measure certain electrical characteristics, such as current, voltage, resistance, power consumption, conductivity, or the like, and provide the measurement data to the controller 112 over the line 120. Such a metrology tool is available from KLA-Tencor, Inc., such as model number 2001X. Alternatively, the metrology tool 110 may be configured to measure feature sizes on the wafer 102, such as line width, gate width, spacing, depth, and the like, and provide the measurement data to the controller 112. Measurements of this type may be useful in determining whether the etching process of the underlying process layers on the wafer 102 have been performed to a sufficient depth, for example. Such a metrology tool is available from Applied Materials as model number 780Si. While the metrology tool 110 is shown receiving the wafer 102 directly from the etcher 108, it is contemplated that in some embodiments of the instant invention additional devices (not shown) may be deployed intermediate the etcher 108 and the metrology tool 110. These intermediate devices may perform additional processes, such as cleaning, rinsing, forming additional layers, etc.

The controller 112 of FIG. 1 may take a variety of forms. For example, the controller 112 may comprise multiple controllers that may be included within the tools 104–110, or it may be a separate device electrically coupled to the tools 104–110 via lines 114–120, respectively. In the embodiment illustrated herein, the controller 112 takes the form of a computer that is controlled by a variety of software programs. The software programs that directly relate to controlling and or monitoring the etcher 108 are discussed in greater detail below in conjunction with FIGS. 5 and 6. Those of ordinary skill in the art having the benefit of this disclosure will appreciate that the controller 112 need not rely on software for its functionality, but rather, a hardware controller may be used to provide the functionality described herein and attributed to the controller 112. Further, the controller 112 need not be is coupled only to the tools 104–110, but rather, could be coupled to and involved in controlling or collecting data from other devices involved in the manufacture of semiconductor devices.

In the illustrated embodiment, the automatic process controller 112 is a computer programmed with software to implement the functions described. However, as will be appreciated by those of ordinary skill in the art having the benefit of this disclosure, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 112, as described, is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 3:
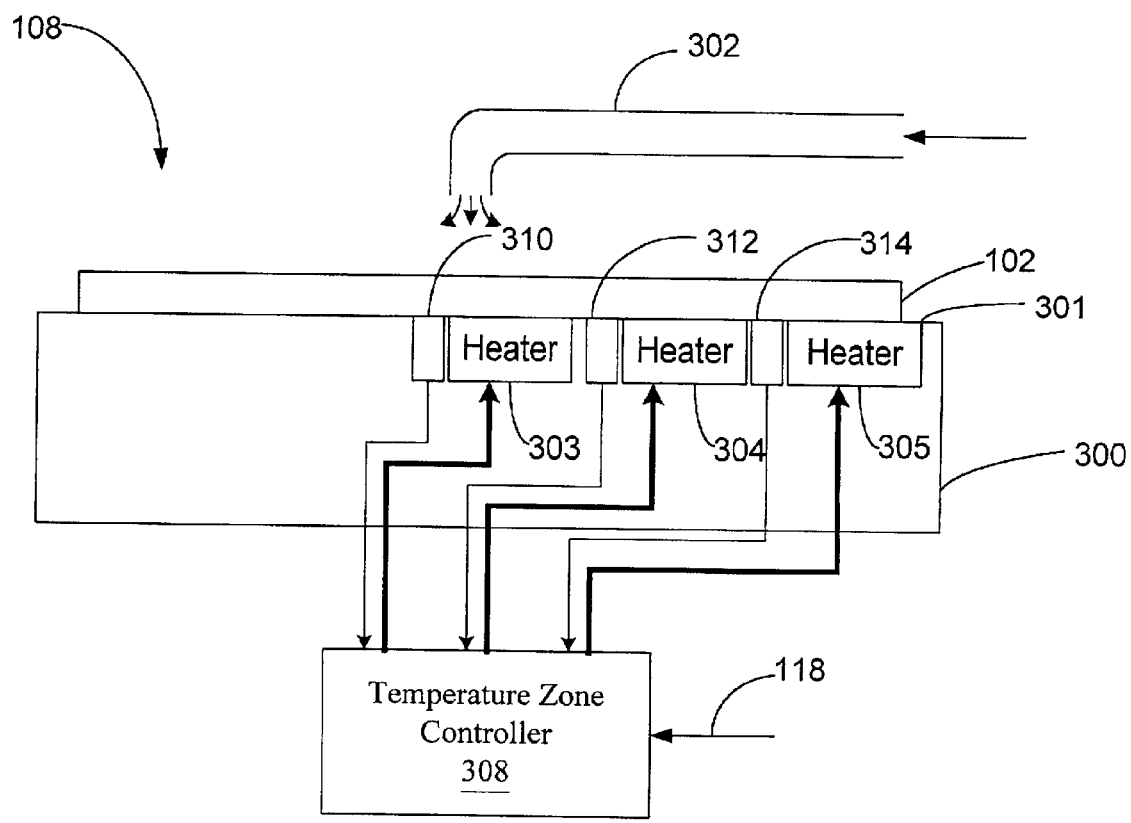
FIG. 3 depicts a side view of a stylized representation of an etcher of FIG. 1.

The etcher 108 may be any of a variety of devices capable of removing underlying process layers not protected by the layer of photoresist. For example, an etcher commercially available from Lam Research as model number 4420 may be modified to allow zoned heating of the wafer 102 to provide greater uniformity of etching across the surface of the wafer 102 in conformity with the instant invention. Referring now to FIG. 3, one stylized embodiment of the etcher 108 is schematically illustrated therein. Generally, the etcher 108 has a chuck 300 configured to receive and hold the wafer 102 while it is being exposed to an etchant. Any of a variety of etchants may be employed without departing from the spirit and scope of the instant invention. In one exemplary embodiment, the etcher 108 employs plasma etching.

The chuck 300 has an upper surface 301 configured to receive the wafer 102 thereon. An etchant delivery system stylistically represented by the pipe 302 delivers etchant onto the surface of the wafer 102 to controllably remove select portions of previously deposited process layers, such as the process layer 204 of FIG. 2.

To enhance the uniformity of the etching process across the surface of the wafer 102, controllable heaters 303–305 are disposed in the chuck 300. It should be appreciated that the etch rate generally increases with increased temperature. Thus, etching within a first zone associated with the heater 303 may be accelerated by raising the temperature of the first zone. The heaters 303–305 operate under control of a temperature zone controller 308, which ultimately receives instructions from the controller 112 over the line 118 to alter the temperature of a zone to reduce or increase its relative etch rate, as compared to the other zones. Thus, the controller 308 may compensate for incomplete etching in one of the zones by instructing the temperature zone controller to raise the temperature of that zone.

While three heaters 303–305 have been illustrated in FIG. 3, it will appreciated that more or fewer heaters may be deployed according to the level of zone control deemed appropriate for a particular application. Additionally, while the heaters 303–305 are used to increase the temperature of a first zone of the chuck 300 relative to a second zone of the chuck 300, it is envisioned that coolers/chillers could be readily substituted therefore, to create a similar temperature variation between the first and second zones. That is, rather than using the heater 303 to raise the temperature of the first zone relative to the second zone, a cooler could be used to lower the temperature of the second zone relative to the first zone, creating a similar temperature variation and attendant variation in the relative etch rates.

Additionally, to accurately control the temperature of the heaters 303–305, it may be useful to deploy temperature sensors 310–314 in each of the zones associated with the heaters 303–305. The sensors 310–314 provide a feedback signal to the temperature zone controller 308, which can be used to adjust the heaters 303–305 and provide the desired temperature identified by the controller 112 for each heater 303–305.

The sensors 310–314 may be any device that is capable of sensing the temperature or temperature changes in the wafer 102, e.g., a thermocouple, an optical pyrometer, etc. The temperature sensors 310–314 may be contact or non-contact devices. For example, the sensors 310–314 may be optical pyrometers that are commonly employed in rapid thermal anneal processing chambers to sense the temperature of the wafer during anneal processes. Additionally, the sensors 310–314 may be of the contact type that may be, at least temporarily, coupled to the wafer 102 in any manner that allows the sensors 310–314 to effectively sense the temperature of the wafer 102. For example, in the illustrative example where the sensors 310–314 are thermocouples, they may be coupled to a bottom surface 316 of the wafer 102 when positioned in the etching tool 108.

Figure 4A:
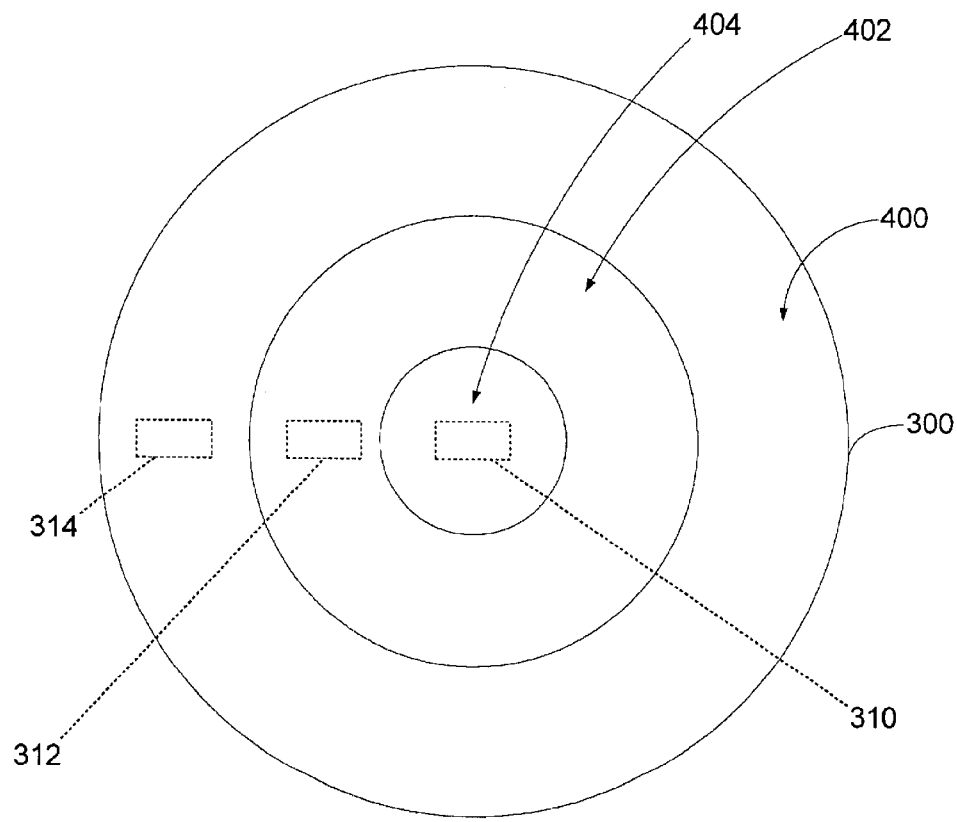
FIG. 4A depicts a top view of a stylized representation of a chuck of the etcher of FIG. 3.

Referring to FIG. 4A, a stylized top view of the chuck 300 of FIG. 3 is shown. The number and location of the sensors 310–314 may vary depending upon the desired degree of control, the composition and purpose of the process layer or device under construction, etc. In the illustrative embodiment depicted in FIGS. 3 and 4A, three sensors 310–314 are used, and they are arranged along an approximately radial line that extends outwardly from a center region 404 of the chuck 300. In the depicted embodiment of FIG. 4A, the sensor 314 may be used to sense the temperature of an edge region 400 of the wafer 102; the sensor 310 may be used to sense the temperature of a center region 404 of the wafer 102; and the sensor 312 may be used to sense the temperature of a middle region 402 of the wafer 102. Of course, different patterns and numbers of sensors may be used, as well as different patterns and numbers of heaters.

Figure 4B:
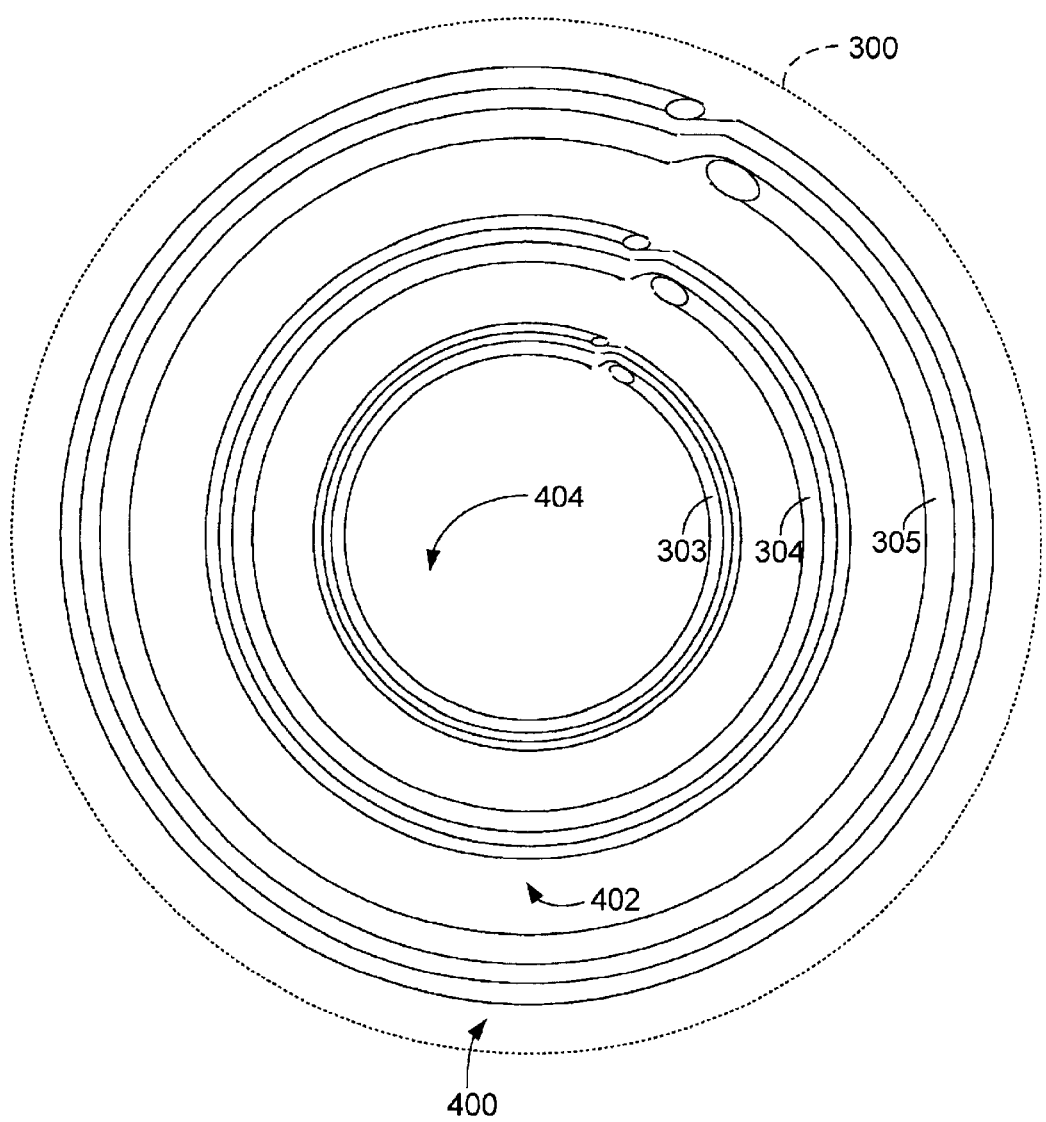
FIG. 4B depicts a top view of a stylized representation of one embodiment of a chuck of the etcher of FIG. 3.

Referring to FIG. 4B, a stylized top view of one embodiment of the structure and position of the heaters 303–305 within the chuck 300 of FIG. 3 is shown. The heaters/coolers 303, 304, 305 are disposed in, and are configured to control, the temperature of, the inner, middle, and edge zones 404, 402, 400, respectively. The heaters/coolers 303–305 may take on any of a variety of forms, such as electrical resistance heaters, hydraulic tubes, pneumatic tubes, and the like. Owing to the circular configuration of the zones 400–404 the layout of the heaters/coolers 303–305 is similarly circular, and in the illustrated embodiment includes a helically wound element or tube. Other configurations are envisioned to accommodate the size and configuration of differing zones that may be needed to compensate for variations in etch rate across the surface of the wafer 102.

Figure 5:
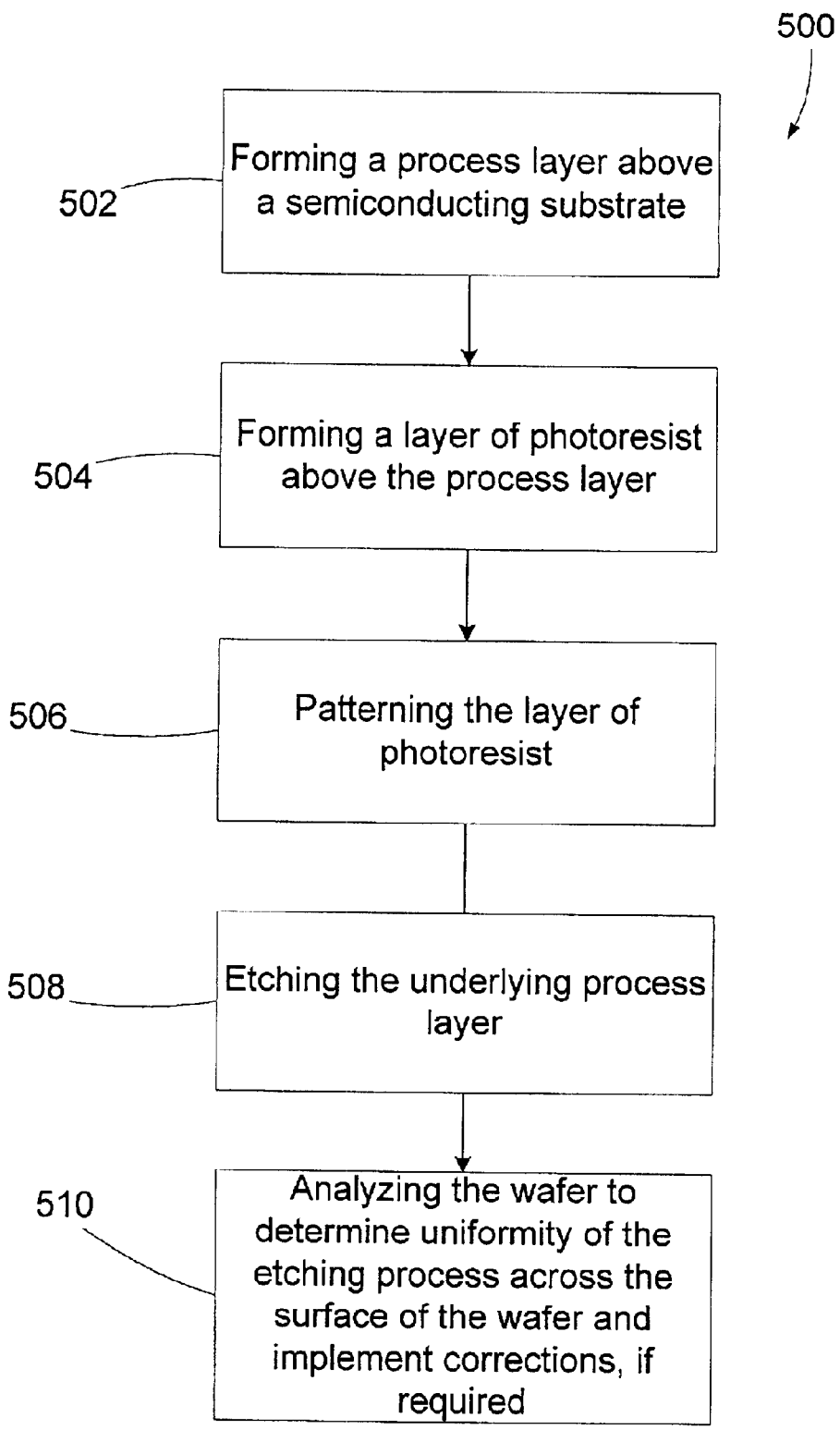
FIG. 5 depicts one illustrative embodiment of a method of the present invention in flowchart form.

Referring to FIG. 5, one illustrative embodiment of a process 500 used to control the etcher 108 is depicted in flowchart form. As shown therein, the present invention comprises the process 500 beginning at block 502 where a process layer is formed on the wafer 102. Thereafter, a layer of photoresist is formed above the process layer, as indicated at block 504. The method further comprises patterning the layer of photoresist, as indicated at block 506, and etching away select portions of the underlying process layer, as indicated at block 508. Thereafter, the wafer 102 is analyzed to determine whether any etching nonuniformity exists, and in which zones. The controller 112 uses this information to instruct the temperature zone controller 308 to vary the temperature of the zones to increase the etch rate of the zone(s) lagging behind the etch rate of the other zone(s).

Figure 6:
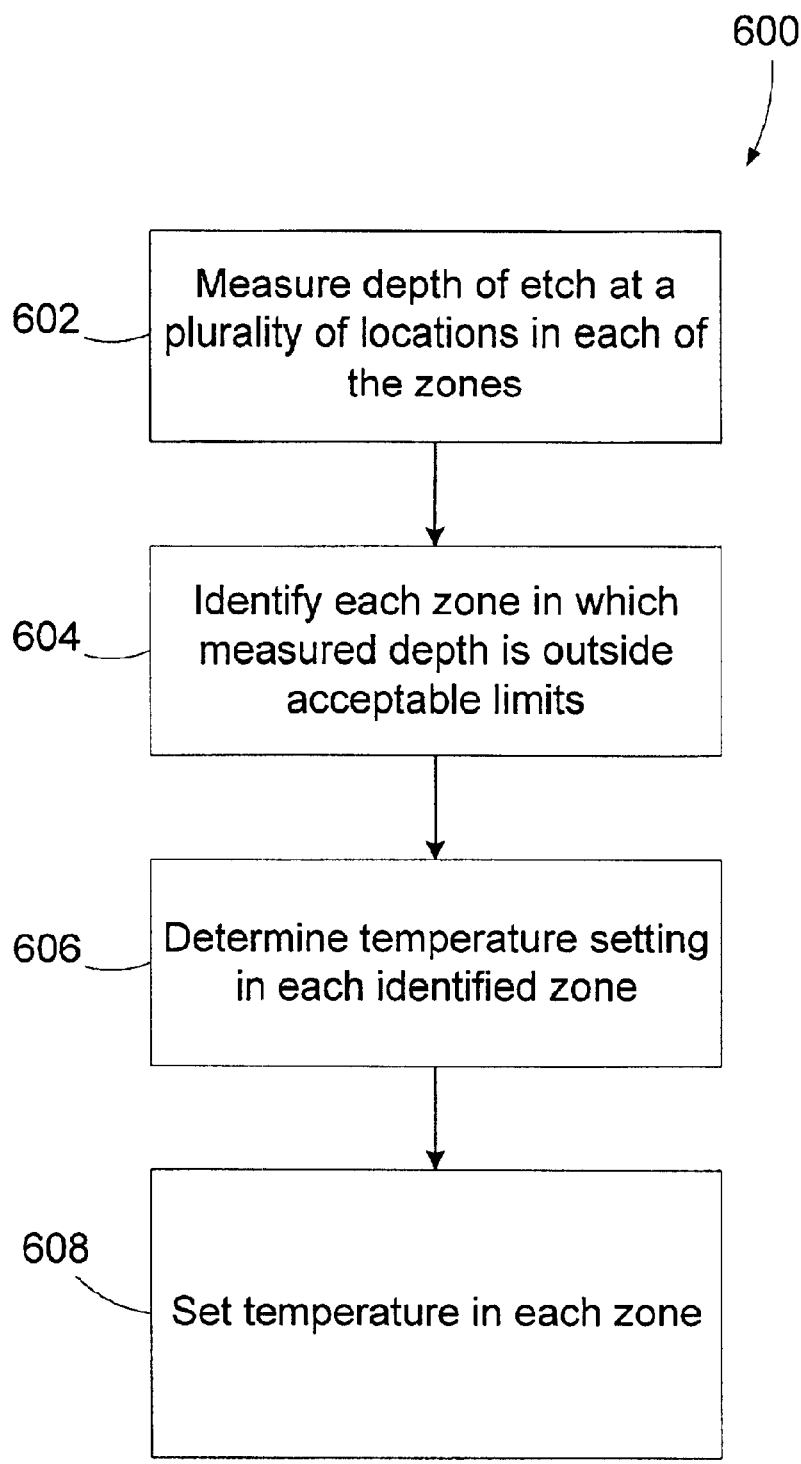
FIG. 6 depicts one illustrative embodiment of a method of the present invention for varying temperature across various zones of the chuck of FIGS. 4A and 4B.

Turning now to FIG. 6, a flowchart depiction of a process 600 used to vary the temperature of the zones, as identified in the block 510, is shown. The process 600 begins at block 602 with the metrology tool 110 measuring the depth achieved by the etch process at a plurality of locations. In one embodiment of the instant invention, the depth is measured in at least one location within each zone. In alternative embodiments, it may be useful to measure the depth of the etch at a plurality of locations within each zone.

Where a plurality of measurements are made in each zone, a criteria may be established for determining when the process identifies a zone needing an adjustment to its etch rate. The criteria may involve averaging the measurements, determining the median value, using the worst case measurement, using the best case measurement, using a ruling majority of measurements, etc. In block 604, the selected criteria is applied to the measurements to identify each zone in which the measured depth of the etch is outside an acceptable limit. For example, the selected criteria from two zones may be compared to one another. That is, the depth of the etch within two different zones may be compared to determine if one of the zones is etching to a substantially lower depth. Alternatively, the measured depths from each of the zones may be compared to a desired depth. That is, even if one zone is etching to a substantially deeper depth, both may still need to be increased if neither has reached a preselected depth. Generally, if the selected criteria is met, the process 600 flags the zone as needing a change in temperature to adjust the etch rate in that zone.

In block 606, the process 600 determines a desired temperature setting for the flagged zones. Determining the desired temperature may be accomplished by a formula and/or a lookup table. The values stored in the lookup table and/or the formula may be derived theoretically, or may be determined empirically. That is, a formula that correlates temperature with etch rates may be used to calculate the desired temperature setting of the zone. Alternatively, a series of test runs at a variety of temperatures may be performed to determine an actual etch rate at a variety of temperatures in a zone. These empirically determined etch rates may then be stored in a lookup table and accessed by the process 600. Alternatively, the desired temperature of a zone may be iteratively adjusted until a uniform etch depth is observed in each zone. That is, each time a wafer 102 is processed by the etcher 108 and measured by the metrology tool 110, the desired temperature may be iteratively adjusted by an amount proportional to the difference in etch depths. That is, the greater the difference in etch depths of the various zones, the greater the correction to the desired temperature.

Finally, in block 608, the desired temperature for each zone is communicated to the temperature zone controller 308. The temperature zone controller 308 modifies the temperature of the zone accordingly by increasing/reducing the appropriate heater/cooler.

The present invention may be employed on a lot-by-lot basis and/or on a wafer-by-wafer basis. In general, the more frequent the measurements, the more uniform and accurate will be the etching process performed by the etcher 108. That is, the uniformity of the etching process need not be measured on each wafer 102, but rather, a previous measurement may be used by the controller 112 to control the zoned heating/cooling in the etcher 108 to produce the desired, uniform etching. The number of wafers processed between measurements is a matter of design discretion, which depends substantially on the details of the particular embodiment.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:

forming a process layer above a semiconducting substrate;

etching at least a portion of said process layer;

measuring a first depth of the etch at a first location in a first preselected region of a plurality of preselected regions of the semiconducting substrate, wherein each of the plurality of preselected regions of the semiconducting substrate has an associated temperature adjusting element;

comparing the first depth to a desired depth;

providing an indication to the temperature adjusting element associated with the first preselected region to adjust the temperature in response to the first depth being different from the desired depth; and adjusting the temperature of at least a portion of the first preselected region in response to receiving the indication.

2. A method, as set forth in claim 1, wherein comparing the first depth to a desired depth further comprises:

measuring a second depth of the etch at a second location in a second preselected region of the semiconducting substrate; and setting the desired depth to the second depth.

3. A method, as set forth in claim 1, wherein the temperature adjusting element is a heating element, wherein adjusting the temperature comprises lowering the temperature of at least the portion of the first preselected region.

4. A method, as set forth in claim 1, wherein forming a process layer above a semiconducting substrate comprises forming a process layer comprised of at least one of an oxide, an oxynitride, polysilicon, and a metal above a semiconducting substrate.

5. A method, as set forth in claim 1, wherein etching at least a portion of said process layer further comprises performing a plasma etching process on at least a portion of the process layer.

6. A method, as set forth in claim 1, wherein the temperature adjusting element is a heating element, wherein adjusting the temperature comprises raising the temperature of at least the portion of the first preselected region.

7. A method, as set forth in claim 1, wherein measuring the first depth further comprises:

measuring the depth at a plurality of locations in the first region; and averaging the plurality of measured depths to determine the first depth.

8. A method, as set forth in claim 1, wherein measuring the first depth further comprises:

measuring the depth at a plurality of locations in the first region; and selecting the smallest measured depth to be the first depth.

9. A method, as set forth in claim 1, wherein measuring the first depth further comprises:

measuring the depth at a plurality of locations in the first region; and selecting the greatest measured depth to be the first depth.

10. A method, as set forth in claim 1, wherein measuring the first depth further comprises:

measuring the depth at a plurality of locations in the first region; and selecting the median measured depth to be the first depth.

11. A method, as set forth in claim 1, further comprises:

measuring the depth of the etch at a second location in a second preselected region of the semiconducting substrate;

comparing the second depth to a second desired depth; and providing a second indication to a second temperature adjusting element associated with the second preselected region to adjust the temperature in response to the second depth being different from the second desired depth; and adjusting the temperature of at least a portion of the second preselected region in response to receiving the second indication.

12. A method, as set forth in claim 11, wherein varying the temperature comprises raising the temperature of the subsequently processed semiconducting substrate in the region corresponding to the second preselected region in response to the second depth being less than the desired depth.

13. A method comprising:

forming a process layer above a semiconducting substrate;

etching at least a portion of said process layer;

measuring a depth of the etch at a plurality of locations in a first preselected region of the semiconducting substrate;

measuring a depth of the etch at a plurality of locations in a second preselected region of the semiconducting substrate;

determining if at least a portion of the first preselected region is etched to a first desired depth based on the measured depth of the plurality of locations in the first preselected region;

varying the temperature of a subsequently processed semiconducting substrate in a region corresponding to the first preselected region in response to determining the at least the portion of the first preselected region is not etched to the first desired depth;

determining if at least a portion of the second preselected region is etched to a second desired depth based on the measured depth of the plurality of locations in the second preselected region; and varying the temperature of a subsequently processed semiconducting substrate in a region corresponding to the second preselected region in response determining the at least the portion of the second preselected region is not etched to the second desired depth.

14. A method, as set forth in claim 13, wherein varying the temperature further comprises raising the temperature of the subsequently processed semiconducting substrate in the region corresponding to the second preselected region in response to determining the at least the portion of the second preselected region is etched less than the second desired depth.

15. A method, as set forth in claim 13, wherein varying the temperature further comprises raising the temperature of the subsequently processed semiconducting substrate in the region corresponding to the first preselected region in response determining the at least the portion of the first preselected region is etched less than the first desired depth.

16. A method, as set forth in claim 13, wherein forming a process layer above a semiconducting substrate comprises forming a process layer comprised of at least one of an oxide, an oxynitride, polysilicon, and a metal above a semiconducting substrate.

17. A method, as set forth in claim 13, wherein etching at least a portion of said process layer further comprises performing a plasma etching process on at least a portion of the process layer.

18. A method, as set forth in claim 13, wherein varying the temperature of the subsequently processed semiconducting substrate in the region corresponding to the first preselected region comprises varying the temperature of the subsequently processed semiconducting substrate in the region corresponding to the first preselected region as a function of the difference.

19. A method, as set forth in claim 13, wherein measuring the depth at the plurality of locations in the first preselected region comprises averaging the plurality of measured depths, and wherein determining if at least the portion of the first preselected region is etched to the first desired depth comprises comparing the average of the plurality of the measured depths to the first desired depth.

20. A method, as set forth in claim 13, wherein measuring the depth at the plurality of locations in the first preselected region comprises determining the smallest measured depth of the plurality of measured depths, and wherein determining if at least the portion of the first preselected region is etched to the first desired depth comprises comparing the smallest measured depth of the plurality of the measured depths to the first desired depth.

21. A method, as set forth in claim 13, wherein measuring the depth at the plurality of locations in the first preselected region comprises determining the greatest measured depth of the plurality of measured depths, and wherein determining if at least the portion of the first preselected region is etched to the first desired depth comprises comparing the greatest measured depth of the plurality of the measured depths to the first desired depth.

22. A method, as set forth in claim 13, wherein measuring the depth at the plurality of locations in the first preselected region comprises determining a median of the plurality of measured depths, and wherein determining if at least the portion of the first preselected region is etched to the first desired depth comprises comparing the median of the plurality of the measured depths to the first desired depth.

23. A method, as set forth in claim 1, further comprising a second semiconductor substrate be processed, and wherein varying the temperature of the subsequently processed semiconductor substrate comprises varying the temperature of the second semiconductor substrate.

24. A method comprising:

forming a process layer above a semiconducting substrate;

etching at least a portion of said process layer;

measuring a first depth of the etch at a first location in a first preselected region of the semiconducting substrate;

measuring a second depth of the etch at a second location in a second preselected region of the semiconducting substrate;

comparing the first depth to the second depth;

varying the temperature of a subsequently processed semiconducting substrate in a region corresponding to the first preselected region in response to the first depth being different from the second depth.

25. A method, as set forth in claim 24, wherein varying the temperature further comprises raising the temperature of the subsequently processed semiconducting substrate in the region corresponding to the first preselected region in response to the first depth being less than the second depth.

26. A method, as set forth in claim 24, wherein varying the temperature further comprises lowering the temperature of the subsequently processed semiconducting substrate in the region corresponding to the first preselected region in response to the first depth being greater than the second depth.

27. A method, as set forth in claim 24, wherein forming a process layer above a semiconducting substrate comprises forming a process layer comprised of at least one of an oxide, an oxynitride, polysilicon, and a metal above a semiconducting substrate.

28. A method, as set forth in claim 24, wherein etching at least a portion of said process layer further comprises performing a plasma etching process on at least a portion of the process layer.

29. A method, as set forth in claim 24, wherein varying the temperature of the subsequently processed semiconducting substrate in the region corresponding to the first preselected region further comprises varying the temperature of the subsequently processed semiconducting substrate in the region corresponding to the first preselected region as a function of the difference.

30. A method, as set forth in claim 24, wherein measuring the first depth further comprises:

measuring the depth at a plurality of locations in the first region; and averaging the plurality of measured depths to determine the first depth.

31. A method, as set forth in claim 24, wherein measuring the first depth further comprises:

measuring the depth at a plurality of locations in the first region; and selecting the smallest measured depth to be the first depth.

32. A method, as set forth in claim 24, wherein measuring the first depth further comprises:

measuring the depth at a plurality of locations in the first region; and selecting the greatest measured depth to be the first depth.

33. A method, as set forth in claim 24, wherein measuring the first depth further comprises:

measuring the depth at a plurality of locations in the first region; and selecting the median measured depth to be the first depth.

34. A method, as set forth in claim 24, further comprising a second semiconductor substrate be processed, and wherein varying the temperature of the subsequently processed semiconductor substrate comprises varying the temperature of the second semiconductor substrate.

\* \* \* \* \*

UNITED STATES PATENT AND TRADEMARK OFFICE
CERTIFICATE OF CORRECTION

PATENT NO.     : 6,746,616 B1
DATED          : June 8, 2004
INVENTOR(S)    : H. Jim Fulford and Jeremy Lansford It is certified that error appears in the above-identified patent and that said Letters Patent is hereby corrected as shown below:

Column 1,
Line 47, after the word "now" delete the word "go".

Column 5,
Line 33, after the words "need not be" delete the word "is".

Column 9,
Line 29, replace "heating" with -- cooling --.

Signed and Sealed this

Twenty-third Day of November, 2004

JON W. DUDAS
*Director of the United States Patent and Trademark Office*